United States Patent [19]

Heuze et al.

[11] 4,314,183

[45] Feb. 2, 1982

[54] SAWTOOTH-GENERATING CIRCUIT

[75] Inventors: Philippe Heuzé; Pierre Lambert, both of Paris, France

[73] Assignee: Thomson-CSF, Paris, France

[21] Appl. No.: 93,495

[22] Filed: Nov. 13, 1979

[30] Foreign Application Priority Data

Nov. 14, 1978 [FR] France .................. 78 32107

[51] Int. Cl.³ .................. H01J 29/70; H01J 29/72
[52] U.S. Cl. .................. 315/389; 315/403
[58] Field of Search .................. 315/389, 387, 403

[56] References Cited

U.S. PATENT DOCUMENTS

| 3,646,393 | 2/1972 | Tarr | 315/403 |
| 3,725,726 | 4/1973 | West | 315/389 |
| 4,176,300 | 11/1979 | Waehner | 315/389 |

FOREIGN PATENT DOCUMENTS 2144275  2/1973  France .

OTHER PUBLICATIONS

Carter et al., *Accurate Broadband Square to Triangle Converter*, Electronic Letters, vol. 13, No. 13, 6-23-77.
Tribolet, *Original Sawtooth Generator*, Electronic Engineering, Dec. 72, vol. 44, No. 538, p. 40.
Brockman, *Synchronous, Ramp Generator Maintains Output Linearity*, Electronics, 1-18-73, vol. 46, No. 2, p. 170.

*Primary Examiner*—Theodore M. Blum
*Attorney, Agent, or Firm*—Cushman, Darby & Cushman

[57] ABSTRACT

A circuit for increasing the stability of a sawtooth signal in regard to thermal drift comprises a conventional generator whose output is controlled by a loop circuit constituted by a switch controlled in opposition with respect to a switch connected in shunt on an integration capacitor, a low-pass filter having a cut-off frequency determined to select substantially the d.c. component and an operational amplifier network for determining the gain of the loop circuit which consequently produces a voltage corresponding to the mean value of the signal. The direct-current voltages and the passive components are so determined that the mean value of the sawtooth signal preferably corresponds to the reference zero potential.

6 Claims, 3 Drawing Figures

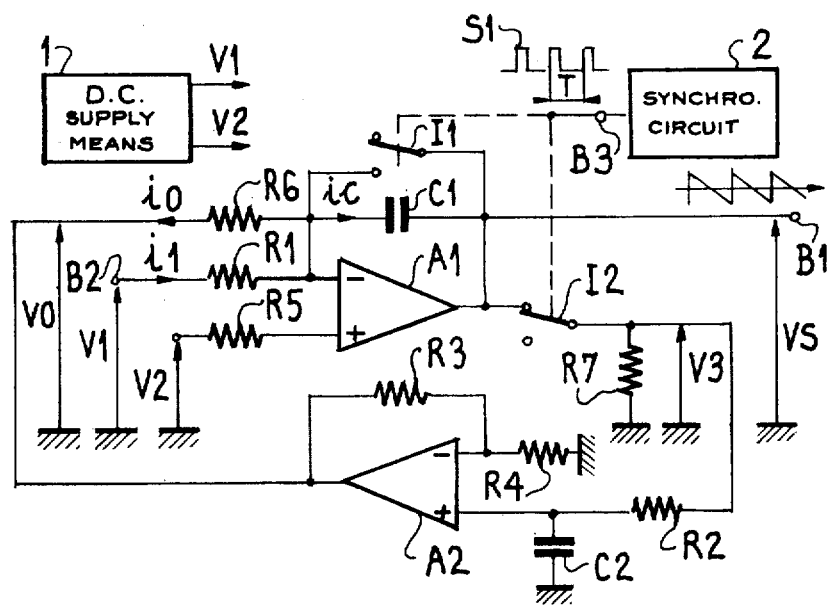
FIG_1
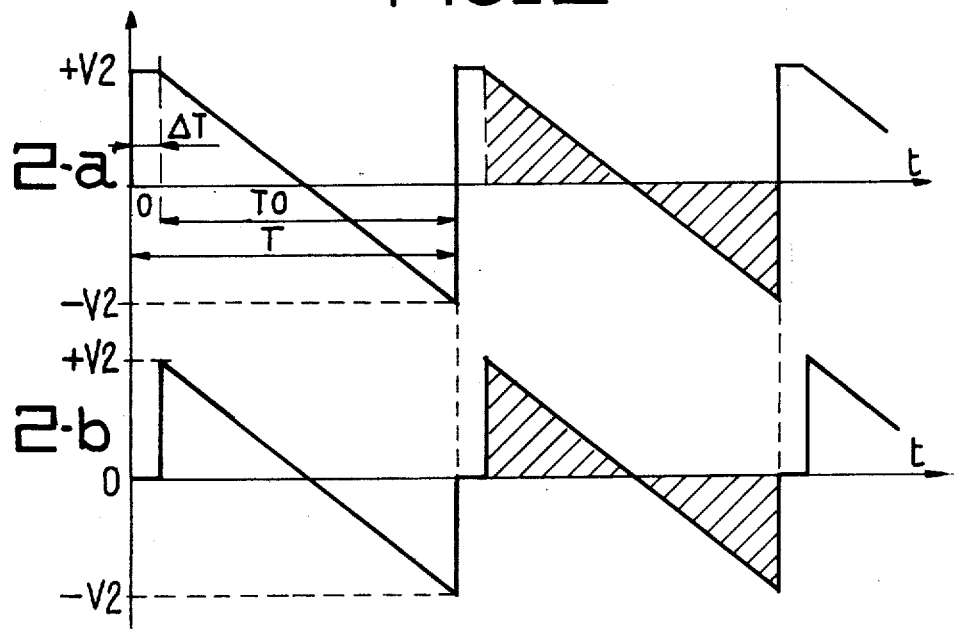
FIG_2

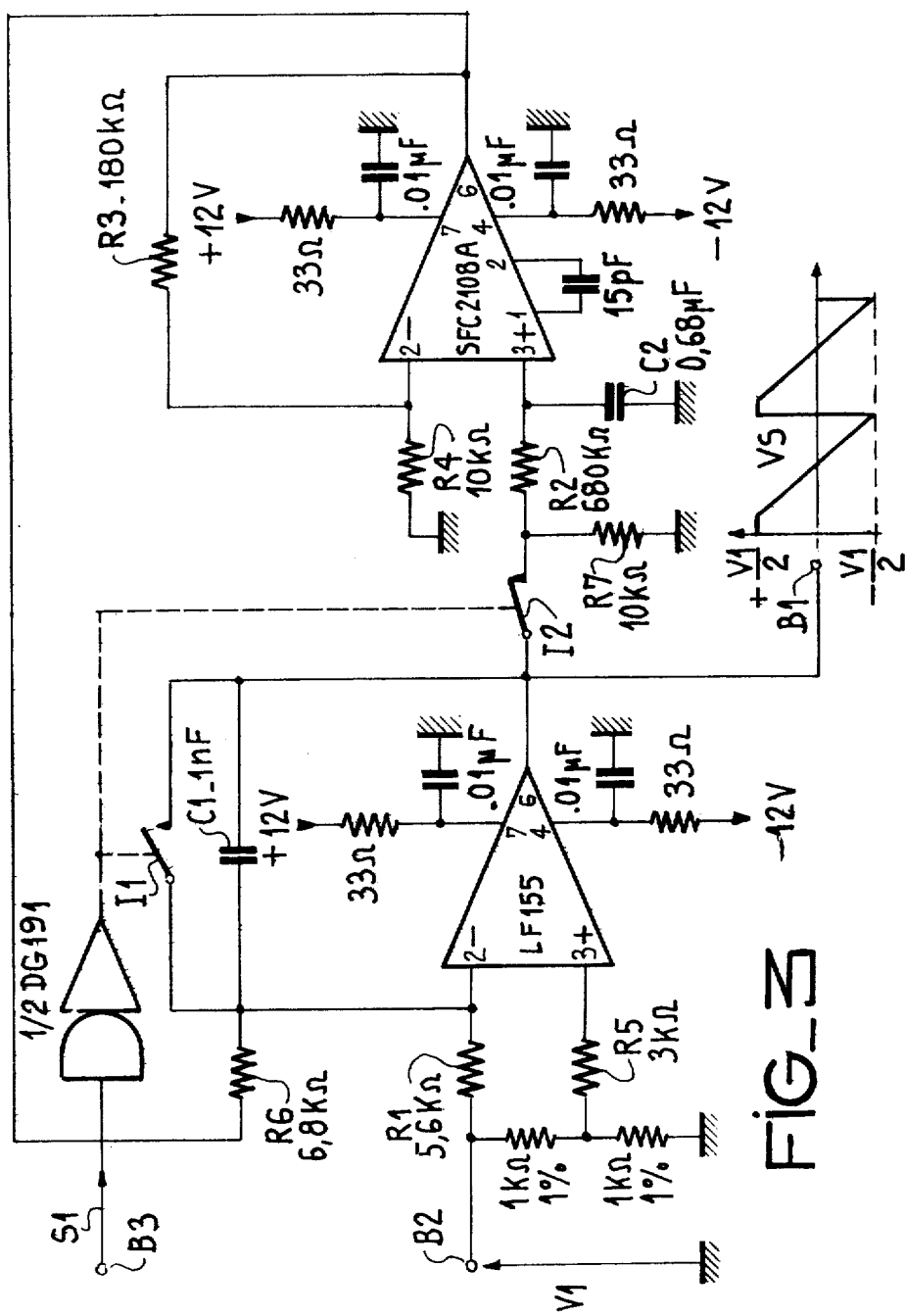
FIG_3

SAWTOOTH-GENERATING CIRCUIT

This invention relates to a circuit for generating sawtooth signals, particularly for cathode-ray scanning of the line-by-line type. The invention is primarily applicable to the construction of the line and field scanning circuits of a black-and-white or three-color television camera.

It is already a known practice to realise an integrating network with an operational amplifier mounted with a capacitor C connected as a negative-feedback impedance between the output and the inverting input to which is applied a constant direct-current voltage through a resistor R. In order to produce sawtooth signals, it is only necessary to discharge the capacitor periodically under the control of a periodic pulse applied to a switching circuit consisting, for example, of an analog gate circuit such as a field-effect transistor connected to the terminals of the capacitor.

The stability of these networks for the generation of scanning sawtooth signals is unreliable when the temperature varies. In order to improve the stabilization of the amplitude of sawtooth signals, use is made of passive (capacitance and resistance) components having a very low temperature coefficient. These components are costly and cumbersome and the stability nevertheless remains limited to about one percent.

The aim of the invention is to provide a sawtooth generating circuit which overcomes these drawbacks and has a high degree of stability which can easily exceed one per thousand in the event of a temperature excursion of 50° C. within the range of −55° C. to +125° C. Moreover, the generating circuit according to the invention offers the advantage of rapid adaptation to changes in amplitude or in frequency of the sawtooth signal. This feature is of considerable interest in the application of the circuit to multi-standard and multi-size television cameras.

According to a distinctive feature of the present invention, provision is made for a sawtooth generating circuit which makes it possible in particular to carry out cathode-ray scanning of the line-by-line type and comprises: an operational amplifier with a capacitor connected between the output and the inverting input, direct-current supply means for producing a first constant positive voltage applied to said input through a first resistor, and a first switching circuit connected to the terminals of the capacitor and periodically closed by a pulse train produced by an associated pulse-generating circuit. Said sawtooth generating circuit is distinguished by the fact that it comprises in addition a control loop connected between the output of the amplifier and the inverting input through a second resistor. The control loop comprises a second switching circuit controlled in operate phase and a low-pass filter circuit to select the D.C. component with a view to producing a voltage corresponding to the mean value of the sawtooth signal. A further characteristic feature lies in the fact that the direct-current supply means produce a second constant positive voltage of lower value than the first voltage and applied to the non-inverting input of the amplifier.

Other features and advantages of the invention will be more apparent to those skilled in the art upon a consideration of the following description and accompanying drawings in which:

FIG. 1 is a diagram of the sawtooth generating circuit according to the invention;

FIG. 2 is a diagram of the waveforms relating to the operation of the circuit according to FIG. 1; and FIG. 3 is a diagram showing one example of an embodiment of the circuit according to FIG. 1 in an application to a line-scanning standard of a television camera.

Referring to FIG. 1, the elements which form a conventional integrating circuit are constituted by the operational amplifier A1, the capacitor C1 and the resistor R1. By applying a direct-current voltage V1 to the free end of the resistor, there is obtained an output voltage $VS = -(1/R1C1)\int V1\, dt$. Since the voltage V1 is a constant voltage delivered by an auxiliary direct-current supply 1 having very high stability, the signal VS resulting from the integration varies linearly with the time interval t. In order to produce scanning sawtooth signals, this basic circuit is completed by an analog switch I1 which is closed periodically at the desired frequency. The block 2 is the schematic representation of an auxiliary circuit for periodic operation of the switch I1 such as a line or field synchronizing circuit which delivers a pulse train S1 at the repetition frequency T which is contemplated.

This network is arranged according to the present invention with a view to ensuring high time stability of the amplitude of the sawtooth signals in the event of variation in ambient temperature.

The arrangements relate primarily to the construction of a loop circuit for controlling the mean value of the sawtooth voltage signal. To this end, the loop circuit comprises a low-pass filter having a very low cut-off frequency (below 10 Hz, for example) in order to pass the D.C. component. The low-pass filter circuit can consist of a R-C circuit represented by the elements R2 and C2 and followed by an amplifier for providing the loop circuit with a predetermined gain; the amplifier comprises an operational amplifier A2 and the resistive elements R3 and R4. There is also produced a second stabilized direct-current voltage V2 having a value which is lower than that of the voltage V1 and which is applied to the non-inverting input of the amplifier A1 through a resistor R5. The loop circuit produces a voltage V0 which is brought back to the inverting input of the amplifier A1 through a resistor R6. The loop serves to compensate for small variations in amplitude of the output signal VS, said variations being essentially caused by temperature drifts of the capacitor C1, of the resistor R1 and of the offset of the amplifier A1. The network produces a sawtooth signal VS which varies between the initial potential +V2 and a lower potential during each operating period. The network is preferentially determined so as to ensure that the sawtooth is symmetrical with respect to the reference zero potential which varies from +V2 to −V2 (FIG. 2a) in respect of an ambient temperature which corresponds substantially to the mean temperature within the range of temperature variation which is contemplated. Under these conditions, the operation of the loop circuit is the most advantageous since the error voltage V0 which is brought back to the input remains at a very small value of amplitude, namely which is equal to zero after action of the loop circuit which does not need to have a high gain. It will be seen below that these preferential conditions of operation result primarily from the choice of the ratio V1/V2 of the values of the elements R1, R6 and C1 and of the time-duration of the sawtooth.

Another arrangement of the sawtooth generating circuit consists in introducing at the input of the loop an analog switching circuit I2 which is similar to the switching circuit I1 and controlled in opposition to this latter. Thus the short time of re-initialization ΔT during which the switching circuit I1 remains closed and the output signal VS undergoes a practically instantaneous transition from −V2 to +V2 so as to remain at this value until re-opening of the switch I1 (FIG. 2a) is not taken into account for measurement of the mean value of the sawtooth; the signal which is taken into account corresponds to the useful portion of the sawtooth having a time-duration T0 as represented by the hatched or shaded areas.

The resistor R7 which is connected between the output of the switch I2 and ground is intended to provide a remedy for transient disturbances which interfere with the operation of the analog switch I2. FIG. 2b represents the signal V3 at the input of the loop circuit.

The operation of the sawtooth generating circuit according to the invention is as follows: when closure of the switch I1 is initiated, the capacitor C1 is instantaneously discharged, thus bringing the output voltage VS to the reference value +V2. When the switch I1 is again caused to open, the capacitor C1 is charged at constant current ic in accordance with the relation ic = $i_1 - i_o$, where $i_1$ is the current which flows through the resistor R1 and $i_o$ is the current which flows through the resistor R6 as indicated in FIG. 1. The values $i_1$ and $i_o$ are given by the relations $i_1 = (V1-V2)/R1$ and $i_o = (V2-V0)/R6$.

Furthermore, VS = V2 − ic/C1 t and supposing that V0 = 0 in a steady state, then by replacing $i_c$ by its value we obtain $$VS = V2\left(1 + \frac{t}{R1C1} + \frac{t}{R6C1}\right) - \frac{V1}{R1C1} t.$$

In order to obtain VS = −V2 at t = T0 the following relation is deduced therefrom:

$$V1 = \left(\frac{2R1C1}{T0} + 1 + \frac{R1}{R6}\right) V2,$$

where $$T0 = \frac{2R1C1}{\frac{V1}{V2} - 1 - \frac{R1}{R6}},$$

to be satisfied and which implies in particular that V1/V2 > 1 + R1/R6, therefore that V1 is greater than V2.

Postulating by way of example that the ratio V1/V2 is equal to 2, we obtain,

T0 = 2·R1R6/R6 − R1·C1, which implies that R6 is greater than R1. The time interval T0 is a constant which is imposed in the case of line or field scanning and the elements R1, R6 and C1 will be determined so as to satisfy the relation.

The complete expression of the charging current is given by $i_c = (V1-V2)/R1 - (V2-V0)/R6$ which shows that this current depends on V0 and clearly demonstrates the action of the loop circuit which restores the mean value V0 at the input of the integrator; this value becomes zero when the sawtooth is perfectly symmetrical. If the curve is dissymmetrical in the vicinity of the positive potentials, for example, an error voltage +V0 appears, the current $i_o$ decreases and the charging current $i_c$ increases; the capacitor C1 is therefore charged more rapidly and the signal VS is brought back progressively to the negative potentials until reduction of the error voltage to zero.

In practice, the voltage V2 will advantageously be obtained from the voltage V1 by means of a fixed-resistor voltage-dividing bridge having high stability, the single voltage V1 being produced by a high-stability direct-current source. Among other advantages, this solution makes it possible to modify the amplitude of the sawtooth without affecting the operation of the loop circuit, this being achieved simply by modifying the parameter V1. The sawtooth then varies about its mid-point (zero-point amplitude, FIG. 2a) with a modified slope. This can be utilized in particular for modifying the scanning format of a motion-picture camera or for carrying out an electronic zoom at the level of the camera tube by under-scanning. The means for regulating the voltage V1 are considered as included within the direct-current supply 1.

In the case of a frequency change and when a departure is made from the contemplated value F = 1/T in order to adopt a rate of closure of the switch I1 at predetermined time intervals, there appears an error signal V0 which produces a correction by the charging current $i_c$.

Postulating that F1 = 1/T1 and T1 = T + ΔT0, and in the case of the example considered in which V1 = 2V2, the calculation of V0 gives:

$$V0 = -(R6-R1)/R1 \cdot \Delta T0/T1 \cdot V2 \text{ or,}$$
$$V0 = -2R6C1 \cdot \Delta F \cdot V2$$

with ΔF = F − F1. This result confirms the operation of the loop circuit in order to maintain the mean value at a zero mean potential when F varies. It is thus possible to modify the recurrence frequency T of the synchronizing signals S1. However, the loop gain in fact limits the maximum permissible variation in the case of the frequency excursion. An excursion of appreciable magnitude is possible while maintaining stability of the loop by modifying the value of the passive component R6. This can be achieved by resistance switching, the resistive element R6 being replaced by another resistive element of different value and designed for this purpose. The network according to the invention permits operation at the line frequency of a camera which conforms to the standards of 525 lines at 60 Hz and 625 lines at 50 Hz without entailing any need to change the passive components; the synchronization period S1 need alone be modified. The frequency-regulating means can be constructed in accordance with known techniques and are considered as included within the pulse-generating circuit 2. The extension to the 875-line, 60 Hz standard may be furthermore obtained, preferably by changing the value of the resistor R6 as previously mentioned.

FIG. 3 gives an example of construction of the sawtooth generating circuit. The voltage V2 is obtained by a resistor-type dividing bridge from a stabilized voltage V1 of 4 volts applied between the terminal B2 and ground. The low-pass filter R2C2 has a cut-off frequency of 2.4 Hz and a theoretical attenuation of 77 dB in the case of the frequency of 15.6 KHz provided for the sawtooth (television standard of 625 lines, 50 Hz). The signal VS is taken from the output terminal B1 and then applied to downstream utilization circuits consisting, for example, of the horizontal deflection circuits of a tube such as a vidicon in the case of a television camera. The components R6, R1 and C1 are determined as a function of the standard contemplated. The generating circuit is more particularly intended to operate on all line-scanning standards in respect of periods ranging in particular from 64 µs (625-line, 50 Hz standard) to 38.1 µs (875-line, 60 Hz standard). The circuit which bears the reference ½ DG 191 includes the switches I1, I2. The generating circuit can be employed both for producing field-scanning sawtooth signals with periods ranging from 16.6 to 20 ms at the frequencies of the standards considered, or for any other application requiring signals having the waveform considered with very high stability characteristics.

What is claimed is:

1. A circuit for generating sawtooth signals, particularly for cathode-ray scanning of the line-by-line type and comprising:

an operational amplifier having a non-inverting input, an inverting input and an output for delivering said sawtooth signal;

a capacitor connected between said output and said inverting input;

direct-current supply means for producing a first constant positive voltage applied to said inverting input through a first resistor, and a second constant positive voltage of lower value than the first voltage and which is applied to the non-inverting input of the amplifier;

a first switching circuit connected to the terminals of the capacitor and caused to close periodically by a pulse train produced by an auxiliary pulse-generating circuit;

a control loop circuit connected between the output and the inverting input of the amplifier the connection to the inverting input being made through a second resistor, the loop circuit comprising a second switching circuit in series with a low-pass filter circuit whose cut-off frequency is selected to pass the D.C. component so as to produce a voltage corresponding to the mean value of the sawtooth signal, said second switching circuit being controlled by said pulse-generating circuit in opposite phase with respect to the first switching circuit.

2. A circuit according to claim 1, wherein the low-pass filter circuit comprises an $R-C$ circuit in series with an operational amplifier the output of which is connected to said second resistor.

3. A circuit according to claim 1, wherein the values of the two direct-current voltages and the values of the first and second resistors and of the capacitor are so determined that the sawtooth is symmetrical on each side of a reference zero potential and the voltage produced by the loop represents the drifts in the mean value of the sawtooth signal with respect to said zero potential.

4. A circuit according to claim 3, wherein the value of the first voltage ($V1$) is double the value of the second voltage ($V2$) and the time-duration ($T0$) of the sawtooth is given by the relation $[2 \cdot R6R1/(R6-R1) \cdot C]$, where C is the integration capacitance, R1 is the first resistor and R6 is the second resistor.

5. A circuit according to claim 2 or claim 3, wherein the second direct-current voltage is produced from the first voltage by means of a resistive divider, an auxiliary direct-current supply delivers the first direct-current voltage, the pulse generator delivers line or field synchronizing pulses of a television scan of the line-by-line type and the sawtooth produced is utilized in order to produce the corresponding horizontal or vertical scan of an associated television camera.

6. A circuit according to claim 1, further comprising means for adjusting the amplitude of the first voltage in order to vary the amplitude of the sawtooth signals and means for adjusting the recurrence frequency of the synchronizing pulses in order to vary the period of the sawtooth signals.

* * * * *